United States Patent

Geffe et al.

[15] 3,689,848

[45] Sept. 5, 1972

[54] VOLTAGE-TO-CURRENT CONVERTER

[72] Inventors: Philip R. Geffe, Laurel; Sylvester C. Tabisz, Baltimore, both of Md.

[73] Assignee: The United States of America as represented by the Secretary of the Navy

[22] Filed: May 4, 1970

[21] Appl. No.: 34,031

[52] U.S. Cl.......................330/30 D, 330/19, 330/69

[51] Int. Cl..............................................H03f 3/68

[58] Field of Search.....330/19, 30 D, 38 M, 69, 30 R

[56] References Cited

UNITED STATES PATENTS 3,316,423 4/1967 Hull........................330/69 X

*Primary Examiner*—Roy Lake

*Assistant Examiner*—Lawrence J. Dahl

*Attorney*—R. S. Sciascia and H. H. Losche

[57] ABSTRACT

A voltage-to-current converter circuit having a differential amplifier with one input coupled to receive voltage signals and an output coupled through transistors in Darlington configuration, the last of which is coupled in a current source circuit to produce a current output from the collector and a negative feedback from the emitter to the other input of the differential amplifier to supply current on the output directly proportional to the input voltage with thermal stability.

1 Claim, 1 Drawing Figure

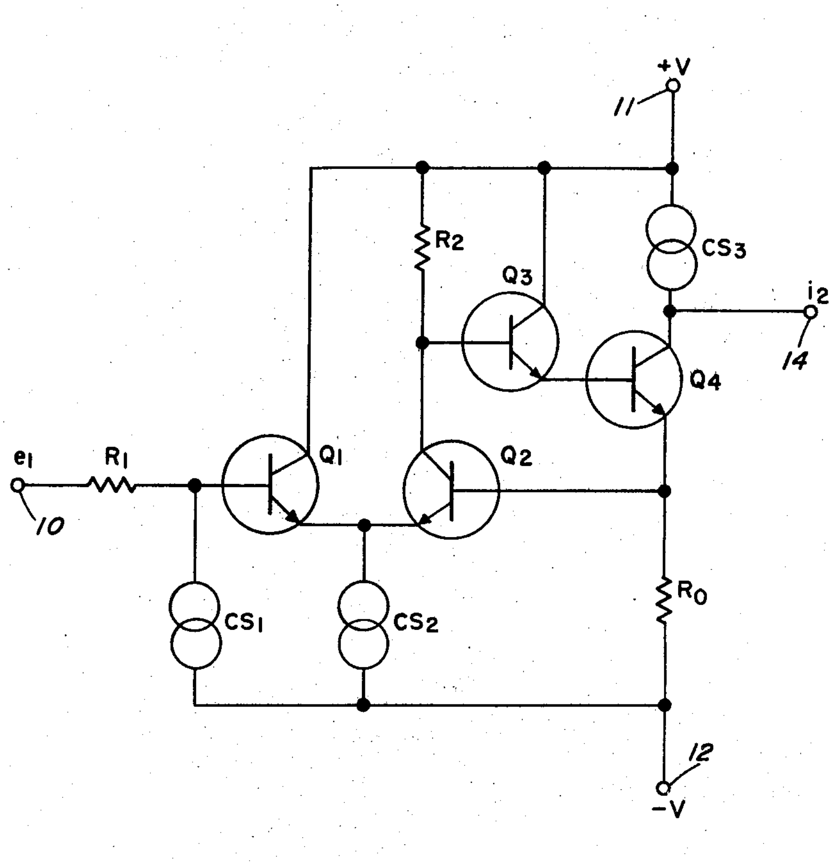
INVENTORS
PHILIP R. GEFFE
SYLVESTER TABISZ
BY
H. H. Loesche
ATTORNEY

VOLTAGE-TO-CURRENT CONVERTER

BACKGROUND OF THE INVENTION

This invention relates to voltage-to-current converters and more particularly to circuits suitable to solid state monolithic constructed integrated circuits which effectively simulates a voltage controlled current source with good thermal stability.

Voltage-to-current converters are known that utilize a differential amplifier in combination with a Darlington circuit having a selector switch in combination with an operational amplifier and a Darlington amplifier to switch in known amounts of offset currents to provide currents proportional to the parameters being measured, primarily in recorders.

SUMMARY OF THE INVENTION

In the present invention a solid state differential amplifier is used in combination with a pair of solid state three element devices, such as transistors, coupled in a Darlington configuration providing a driver and output pair. One input to the differential amplifier is the input voltage to be converted and the other input to the differential amplifier is a feedback voltage from the last of output transistor. NPN type transistors are preferable in which the output current signal is taken from the collector terminal and the feedback voltage is taken from the emitter. A current source is coupled to the collector of this last output transistor. Current sources are also used to bias the base electrode input to the differential amplifier. This voltage-to-current converter, through its negative feedback function, provides good temperature stability and is quite appropriate for manufacture, in an integrated monolithic module, as a part of a gyrator circuit. It is accordingly a general object of this invention to provide a thermally stable voltage-to-current converter suitable for manufacture of a monolithic solid state converter module readily adaptable for use singly or in pairs to complete a gyrator circuit.

BRIEF DESCRIPTION OF THE DRAWING

These and other objects and the attendant advantages, features, and uses will become more apparent to those skilled in the art as a more detailed description proceeds when considered along with the accompanying single FIGURE of drawing illustrating the invention in circuit schematic form.

DESCRIPTION OF THE PREFERRED EMBODIMENT

Referring more particularly to the drawing an input terminal 10 is coupled through a resistor R1 to the base of the first transistor Q1 in a pair of transistors Q1 and Q2 of a differential amplifier. The emitters of transistors Q1 and Q2 are coupled in common while the collector of transistor Q1 is directly coupled to a positive voltage source at terminal 11 and the collector of transistor Q2 is coupled through a resistor R2 to the positive voltage source of terminal 11. The base of transistor Q1 is biased from a negative voltage source at terminal 12 through a current source CS1 while the common emitters of Q1 and Q2 are biased from the negative voltage source terminal 12 through a current source CS2.

A collector of transistor Q2 is coupled to the base of a driver transistor Q3 having its collector directly coupled to the positive voltage terminal 11 and its emitter coupled to the base of an output transistor Q4. The collector of transistor Q4 is coupled through a current source CS3 to the positive voltage terminal 11 and its emitter is coupled in common to the base of transistor Q2 in the differential amplifier and to one terminal of a resistor $R_0$, the opposite terminal of which is coupled to the negative voltage source terminal 12. An output terminal for the circuit is identified by the reference character 14 coupled directly to the collector terminal of the output transistor Q4 to provide an output current, $i_2$, directly proportional to the control voltage input, $e_1$, applied to terminal 10.

The circuit shown in the drawing is readily adaptable to be manufactured for an inexpensive monolithic processing means to provide a monolithic module except that resistor $R_0$ be maintained externally of the circuit, as will later be made clear.

OPERATION

In the operation of the preferred embodiment shown in the drawing a voltage, $e_1$, applied to the terminal 10 will control the current, $i_2$, at the terminal 14 in direct proportion thereto to establish voltage-to-current converter operation. The input voltage $e_1$ drives the modified differential amplifier Q1,Q2 so that the amplified voltage appears at the base of the driver transistor Q3. The main purpose of the driver transistor Q3 is to provide an adequate base-to-collector direct current (D.C.) voltage for Q2 but it also serves to unload the differential amplifier output and to increase the open loop gain. Q3 then drives the output transistor Q4. Since the collector impedance of transistor Q4 is very high and typically above 20 megohms and since the impedance of the current source CS3 is of about the same magnitude, the output current $i_2$ develops in direct proportion to the input voltage $e_1$. The emitter signal voltage of the output transistor Q4 being very nearly equal to the base signal voltage of the driver transistor Q3 is suitable for negative feedback to the differential amplifier and is thus applied as the second input to the base of transistor Q2. Since this feedback voltage is proportional to the output current $i_2$ it serves to increase the linearity and the thermal stability of the ratio $i_2/e_1$. These advantages exist in proportion to the gain of the differential amplifier so it is desirable to increase this open loop gain as much as is consistent with whatever bandwidth is desired for the circuit performance. When the highest possible stability is desired and high frequency performance is not an object, the resistor $R_2$ would be replaced with a current source or the combination of a current source and a resistor so as to obtain the highest low frequency gain which is possible for a gain choice of transistor type for Q1 and Q2. One purpose of this circuit arrangement is to prevent any dependence of the ratio $i_2/e_1$ on the temperature coefficients of the diffused resistors which are used in integrated circuits. Because $i_2$ is approximately equal to $-e_1/R$ɩt is necessary for the user to supply a stable resistor $R_0$ which is external to the integrated circuit chip. Dependence of $i_2/e_1$ on diffused resistor ratios must also be avoided for high stability. Accordingly, Q1 in the differential amplifier is biased at zero D. C. potential at both the input and the output by $R_1$ and CS1. From the input terminal the impedance of CS1 is in megohms while $R_1$ is less than 10,000 ohms to hold signal attenuation to a minimum. It may be noted that in this circuit all transistors are NPN type transistors for signal amplification. PNP type transistors may be used as the current sources CS1, CS2, and CS3 and are suitable despite their poor bandwidth and low current gain. Any voltage $e_1$ applied to the terminal 10, then, will be amplified by the differential amplifier Q1, Q2 and the output applied to the driver transistor Q3 to control the output transistor Q4 current through CS3 in the collector circuit from terminal 14 and the feedback voltage to the base of transistor Q2 to produce a voltage controlled current $i_2$ at the output terminal 14 directly proportional to the input voltage $e_1$.

This circuit provides a voltage-to-current converter readily adaptable for use in integrating circuit gyrators providing good thermal stability for gyrator operation in synthesizing inductances, or where two such circuits are used to synthesize transformers. Accordingly, a voltage-to-current converter is provided which is suitable for inexpensive monolithic construction which effectively simulates a voltage controlled current source with good thermal stability.

While other modifications may be readily apparent from the teaching of the first embodiment shown and described herein, we desire to be limited in the spirit of our invention only by the scope of the appended claim.

We claim:

1. A solid state voltage-to-current converter circuit comprising:

a single differential transistor amplifier having two inputs to base electrodes, two emitter coupled electrodes, and a collector output;

a voltage signal input coupled to one input of said differential amplifier through a resistor, said one input being coupled through a biasing current source to a voltage source;

a pair of emitter-to-base coupled transistors consisting of a driver transistor and an output transistor, the base of the driver transistor being coupled to said differential amplifier collector output, the emitter of said output transistor being coupled to the other input of said differential amplifier, and the collector of said output transistor constituting the output of said converter circuit; and current sources coupled to said differential amplifier emitter coupled electrodes and to said output transistor collector to provide current therefor and said voltage source coupled to the collectors of said differential amplifier transistors, to the collector of said driver transistor and through biasing resistors to said other base input of said differential amplifier and said base input of said driver transistor whereby the output current is directly proportional to the input voltage with good thermal stability.

* * * * *